United States Patent
Sterzbach

(10) Patent No.: US 11,867,725 B2
(45) Date of Patent: Jan. 9, 2024

(54) MEASUREMENT INSTRUMENT

(71) Applicant: Rohde & Schwarz GmbH & Co. KG, Munich (DE)

(72) Inventor: Bernhard Sterzbach, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 281 days.

(21) Appl. No.: 17/091,775

(22) Filed: Nov. 6, 2020

(65) Prior Publication Data

US 2022/0146554 A1 May 12, 2022

(51) Int. Cl.
*G01R 13/02* (2006.01)

(52) U.S. Cl.
CPC ......... *G01R 13/0218* (2013.01); *G01R 13/02* (2013.01); *G01R 13/029* (2013.01)

(58) Field of Classification Search
CPC ... G01R 13/02; G01R 13/0218; G01R 13/029
See application file for complete search history.

(56) References Cited

U.S. PATENT DOCUMENTS

| 6,571,185 B1 | 5/2003 | Gauland et al. |
| 2003/0125898 A1* | 7/2003 | Stark ...................... G16H 40/63 |
| | | 702/123 |

| 2018/0259579 A1* | 9/2018 | Sobolewski ..... G01R 31/31912 |
| 2019/0245632 A1* | 8/2019 | Sterzbach .............. H04B 17/16 |
| 2020/0166546 A1* | 5/2020 | O'Brien ............... G01R 13/029 |

FOREIGN PATENT DOCUMENTS

EP 3293528 A2 3/2018

* cited by examiner

*Primary Examiner* — Son T Le
*Assistant Examiner* — Adam S Clarke
(74) *Attorney, Agent, or Firm* — DITTHAVONG, STEINER & MLOTKOWSKI

(57) ABSTRACT

The invention relates to a measurement instrument, such as an oscilloscope, comprising a measurement unit adapted to receive an input signal, and a processing unit adapted to classify the input signal, preferably based on signal parameters or characteristics of the input signal. wherein the processing unit is adapted to determine a signal analysis category for the input signal based on said classification of the input signal, and to match the determined signal analysis category to a control configuration, which defines settings and/or configurations of the measurement instrument, based on an adjustment function. The measurement instrument further comprises a user interface configured to display at least one graphical representation, in particular a waveform, of the input signal based on the control configuration, wherein the user interface is adapted to receive a user input to modify the settings and/or configurations of the measurement instrument, and wherein the processing unit is configured to dynamically adapt the adjustment function based on said user input.

14 Claims, 4 Drawing Sheets

MEASUREMENT INSTRUMENT

TECHNICAL FIELD OF THE INVENTION

The invention relates to a measurement instrument, such as an oscilloscope, and to a method for operating such a measurement instrument. The invention further relates to a system for updating measurement instruments.

BACKGROUND OF THE INVENTION

Measurement instruments, such as oscilloscopes, are typically configured to receive and display measurement signals. For instance, an oscilloscope can display a varying signal level of an input signal over time. This displayed waveform can, then, further be analyzed by adjusting various measurement and display parameters of the instrument depending on a current measurement task. However, manually performing such adjustments can be cumbersome, especially for inexperienced users.

Therefore, some measurement instruments assist the user in adjusting the instrument settings via set-up dialogues, e.g. "configuration wizards" or digital set-up manuals. Furthermore, some measurement instruments have auto-adjustment capabilities, i.e. they are configured to automatically adjust certain instrument settings without the user having to make these settings himself. The document U.S. Pat. No. 6,571,185 Bi, for example, discloses a method of automatically setting up a digital oscilloscope in response to an input signal.

However, most of these user-assisting techniques are pre-set during the manufacturing of the instrument and cover only a fraction of possible usage scenarios and measurement signals. Often, the user has to perform an additional manually adjustment according to his preferences and the current measurement task.

Thus, it is an objective to provide an improved measurement instrument, an improved method for operating a measurement instrument as well as an improved system for updating a measurement instrument, which avoid the above-mentioned disadvantages. In particular, it is an object to provide a measurement instrument with improved automatic adjustment capabilities.

SUMMARY OF THE INVENTION

The object of the present invention is achieved by the solution provided in the enclosed independent claims. Advantageous implementations of the present invention are further defined in the dependent claims.

According to a first aspect, the invention relates to a measurement instrument, such as an oscilloscope, comprising a measurement unit adapted to receive an input signal; a processing unit adapted to classify the input signal, preferably based on signal parameters or characteristics of the input signal; wherein the processing unit is adapted to determine a signal analysis category for the input signal based on said classification of the input signal, and to match the determined signal analysis category to a control configuration, which defines settings and/or configurations of the measurement instrument, based on an adjustment function; and a user interface configured to display at least one graphical representation, in particular a waveform, of the input signal based on the control configuration; wherein the user interface is adapted to receive a user input to modify the settings and/or configurations of the measurement instrument; and wherein the processing unit is configured to dynamically adapt the adjustment function based on said user input.

This achieves the advantage that the measurement instrument can learn from typical user preferences and settings to provide an improved automatic adjustment of its instrument settings for specific input signals. In particular, the measurement instrument can gradually improve and adapt the adjustment function for certain input signal categories on the basis of actual user settings and adjustments.

Preferably, classifying the input signal comprises determining a type of the input signal, e.g. continuous or discrete signal, determining certain signal parameters, e.g. a frequency range of the signal, and/or determining the signal source. Furthermore, classifying the input signal may comprise determining an integrity or quality of the input signal.

Preferably, the signal analysis category determines which measurement tasks are carried out by the measurement instrument to analyze the input signal. A plurality of different signal analysis categories for different classes of input signals can be pre-stored in a memory of the measurement instrument. In particular, each stored signal analysis category can be a model comprising a set of measurement tasks.

In particular, matching the signal analysis category to the control configuration based on the adjustment function may refer to determining a certain control configuration, i.e. certain instrument configurations or settings, based on the determined signal analysis category. To determine a suitable control configuration, the adjustment function may comprise a set of rules to compile the control configuration based on the current signal analysis category. Alternatively, various pre-stored control configurations can be selected by the adjustment function depending on the signal analysis category. The adjustment function can be configured to additionally take the signal class and/or other parameters of the input signal into account when compiling or selecting the control configuration.

Preferably, the processing unit is adapted to dynamically adapt the adjustment function based on the changes made by the user to the initially determined control configuration.

The user interface can comprise a display unit which is configured to display the at least one waveform of the input signal. The display unit can comprise a touch display, which is configured to receive the user input.

In particular, the user interface can be configured to display the control configuration or certain aspects of the control configuration for the determined signal analysis category in addition to the at least one waveform.

The measurement unit can comprise a measurement interface for receiving the input signal and/or means for processing the input signal, such as an analog-to-digital converter or a filter. The input signal can be any measurement signal, e.g. an RF signal that can be received by the measurement interface. For example, the input signal is generated by a device-under-test, which is connected to the measurement interface.

Preferably, the measurement instrument comprises a memory, e.g. a flash memory, configured to store a catalogue of signal analysis categories and/or the adjustment function.

In an embodiment, the processing unit is adapted to learn from a difference between the settings and/or configurations defined by the control configuration and the modifications to said settings and/or configurations made by the user input.

In particular, this learning comprises the adaption of the adjustment function based on the user input.

In an embodiment, the processing unit is configured to execute a machine-learning algorithm, in particular an incremental learning algorithm, which is configured to dynamically adapt the adjustment function based on the user input. This achieves the advantage that the measurement instrument can efficiently learn typical user preferences and settings to provide optimized control configurations over time.

In particular, the processing unit may comprise a neural network configured to execute the machine-learning algorithm.

In an embodiment, the processing unit is configured to determine a current user of the measurement instrument, wherein the adjustment function is configured to match the control configuration to the determined signal analysis category based on the current user of the measurement instrument.

In other words, the processing unit considers the current user, when matching the control configuration to the determined signal analysis category. Depending on the user of the instrument, alternative control configurations can be matched.

In particular, the processing unit can be configured to distinguish different users based on login information, name entries or selections made by the users.

In an embodiment, the processing unit is configured to dynamically adapt the adjustment function based on said user input and the identity of the user making said user input. This achieves the advantage that the measurement instrument can efficiently learn typical preferences and settings from different users separately.

In an embodiment, the measurement instrument further comprises a network interface adapted to transmit information about the input signal and/or the user input to a remote server, in particular a cloud server. This achieves the advantage that information about typical user preferences and settings from various measurement instruments can centrally be stored and further processed.

All the above-mentioned embodiments and/or optional features of the measurement instrument can be combined.

According to a second aspect, the invention relates to a system for updating measurement instruments, comprising at least one measurement instrument, such as an oscilloscope, having a measurement unit adapted to receive an input signal, and a user interface adapted to display at least one waveform of the input signal based on a control configuration, which defines settings and/or configurations of the measurement instrument, wherein the user interface is adapted to receive a user input to modify the settings and/or configurations of the measurement instrument. The system further comprises a remote server, in particular a cloud server; wherein the at least one measurement instrument and the remote server are connected via a communication network; wherein the at least one measurement instrument is configured to forward information about the input signal and/or the user input to the remote server; and wherein the remote server is configured to analyze the information about the input signal and/or the user input and to generate update data for updating the at least one measurement instrument based on said analysis. This achieves the advantage that measurement instrument can be efficiently updated based on an analysis of typical user preferences and settings.

Preferably, the at least one measurement instrument comprises a processing unit adapted to classify a respective input signal, e.g. based on signal parameters or characteristics of the input signal. The processing unit of the at least one measurement instrument can further be adapted to determine a signal analysis category for the input signal based on said classification of the input signal, and to match the determined signal analysis category to the control configuration based on an adjustment function. The control configuration may define settings and/or configurations of the at least one measurement instrument.

In an embodiment, the update data comprises data to update an adjustment function of the at least one measurement instrument, wherein the adjustment function is configured to generate and/or select the control configuration of the at least one measurement instrument. This achieves the advantage that the update can improve an automatic adjustment of instrument settings to specific input signals.

In an embodiment, the remote server is configured to receive information about input signals and associated user input from multiple different measurement instruments that are connected to the communication network, wherein the remote server is configured to generate the update data based on an analysis of the received information from the multiple different measurement instruments. This achieves the advantage that update data can efficiently be generated based on a large dataset from multiple measurement instruments.

In an embodiment, the remote server is configured to execute a machine-learning algorithm, in particular an incremental learning algorithm, to analyze the information about the input signal and/or the user input, and/or to generate the update data. This achieves the advantage that the update data can be generated efficiently.

In an embodiment, the remote server is configured to forward the update data to the at least one measurement instrument via the communication network. This achieves the advantage that the at least one measurement instrument can be updated efficiently.

All the above-mentioned embodiments and/or optional features of the system can be combined.

According to a third aspect, the invention relates to a method for controlling a measurement instrument, such as an oscilloscope, comprising the steps of:
  receiving an input signal;
  classifying the input signal, preferably based on signal parameters or characteristics of the input signal;
  determining a signal analysis category for the input signal based on said classification of the input signal;
  matching the determined signal analysis category of the input signal to a control configuration, which defines settings and/or configurations of the measurement instrument, based on an adjustment function;
  displaying at least one graphical representation, in particular a waveform, of the input signal based on the control configuration;
  receiving a user input to modify the settings and/or configurations of the measurement instrument;
  dynamically adapting the adjustment function based on said user input.

This achieves the advantage that the measurement instrument can learn from typical user preferences and settings to provide an improved automatic adjustment of its instrument settings for specific input signals. In particular, the measurement instrument can gradually improve and adapt the adjustment function for certain input signal categories on the basis of actual user settings and adjustments.

In an embodiment, the method comprises the further step of: learning from a difference between the settings and/or configurations defined by the control configuration and the modifications to said settings and/or configurations made by the user input.

In an embodiment, the adjustment function is dynamically adapted based on the user input by a machine-learning algorithm, in particular an incremental learning algorithm. This achieves the advantage that the measurement instrument can efficiently learn typical user preferences and settings to provide optimized control configurations over time.

In an embodiment, a current user of the measurement instrument is determined, wherein the adjustment function is configured to match the control configuration to the determined signal analysis category based on the current user of the measurement instrument.

In an embodiment, the adjustment function is dynamically adapted based on said user input and the identity of the user making said user input. This achieves the advantage that the measurement instrument can efficiently learn typical user preferences and settings to improve the adjustment function over time.

In an embodiment, the method further comprises the step of: transmitting information about the input signal and/or the user input to a remote server, in particular a cloud server. This achieves the advantage that information about typical user preferences and settings from various measurement instruments can be centrally stored and further processed.

All the above-mentioned embodiments and/or optional features of the method for controlling the measurement instrument can be combined.

The above description with regard to the measurement instrument according to the first aspect of the invention is correspondingly valid for the method for controlling the measurement instrument according to the third aspect of the invention.

BRIEF DESCRIPTION OF THE DRAWINGS

The invention will be explained in the followings together with the figures.

DETAILED DESCRIPTION OF THE PREFERRED EMBODIMENTS

Figure 1:
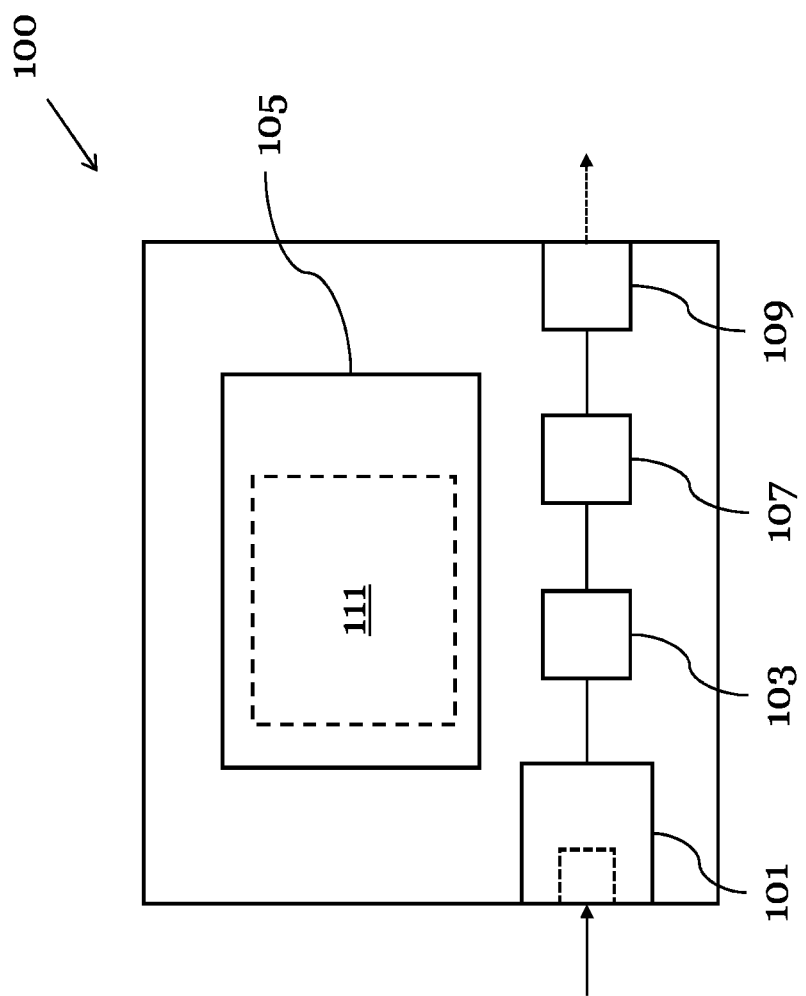
FIG. 1 shows a schematic diagram of a measurement instrument according to an embodiment.

FIG. 1 shows a schematic diagram of a measurement instrument 100 according to an embodiment.

The measurement instrument 100 comprises a measurement unit 101 adapted to receive an input signal and a processing unit 103 adapted to classify the input signal, preferably based on signal parameters or characteristics of the input signal. The processing unit 103 is further adapted to determine a signal analysis category for the input signal based on said classification of the input signal, and to match the determined signal analysis category to a control configuration based on an adjustment function, wherein the control configuration defines settings and/or configurations of the measurement instrument 100. The measurement instrument 100 further comprises a user interface 105, which is configured to display at least one waveform of the input signal based on the control configuration. The user interface 105 is further configured to receive a user input to modify the settings and/or configurations of the measurement instrument 100, wherein the processing unit 103 is configured to dynamically adapt the adjustment function based on said user input.

In particular, the signal analysis category may determine which measurement tasks are carried out by the measurement instrument in order to analyze the input signal.

In particular, during operation of the measurement instrument 100, the measuring scenario, e.g. the input signals, can continuously be evaluated and classified by the processing unit 103 in order to determine the signal analysis category of the current measuring task among a catalog of measuring tasks. The processing unit 103 is then configured to select the control configuration as a set of plausible measurement instrument configurations, wherein each measurement instrument configuration may comprise a list of instrument parameter settings and a preview of the resulting visual. To generate the control configuration, the processing unit 103 can execute the adjustment function, which comprises rules to determine which instrument parameter settings are chosen for a certain signal analysis category. Thereby, the adjustment function can also take the signal class and/or other signal properties into account.

The user interface 105 can comprise a display unit 111 which is configured to display the at least one waveform of the input signal based on the selected control configuration. The display unit 111 can comprise a touch display, which is configured to receive the user input. In particular, the user interface 105 can be configured to display the control configuration or certain aspects of the control configuration for the determined signal analysis category in addition to the at least one waveform.

The measurement unit 101 can comprise a measurement interface for receiving the input signal and/or means for processing the input signal, such as an analog-to-digital converter or a filter. The input signal can be any measurement signal, e.g. a radio frequency (RF) signal that can be received by the measurement interface. For example, the input signal is generated by a device-under-test, which is connected to the measurement interface.

The measurement instrument 100 in FIG. 1 further comprises a memory 107, e.g. a flash memory. The memory 107 can be configured to store a plurality of signal analysis categories and the adjustment function.

Preferably, the processing unit 103 is configured to execute a machine-learning algorithm, in particular an incremental learning algorithm, which is configured to dynamically adapt the adjustment function based on the user input.

Preferably, the processing unit 103 is configured to determine a current user of the measurement instrument, for instance based on a user login or password. The adjustment function can be configured to match the control configuration to the determined signal analysis category based on the current user of the measurement instrument, such that a control configuration is provided that is optimized for the current user of the instrument.

The processing unit 103 can further be configured to take into account the user preferences of the current user when dynamically adapting the adjustment function.

Preferably, the processing unit 103 is configured to execute a machine-learning algorithm, in particular an incremental learning algorithm, which is configured to dynamically adapt the adjustment function based on the user input.

From observing the operation of the instrument 100, the machine-learning algorithm may also assess how well the user is acquainted with the instrument 100 and may configure UI settings (e.g. easy mode/expert mode) accordingly.

The measurement instrument 100 in FIG. 1 further comprises a network interface 109. The network interface 109 can be adapted to transmit information about the input signal and/or the user input to a remote server, in particular a cloud server.

For instance, the measurement instrument 100 is a signal analyzer, an oscilloscope, a (cellular) network analyzer, an audio analyzer and/or an EMC & field strength-testing device.

Figure 2A:
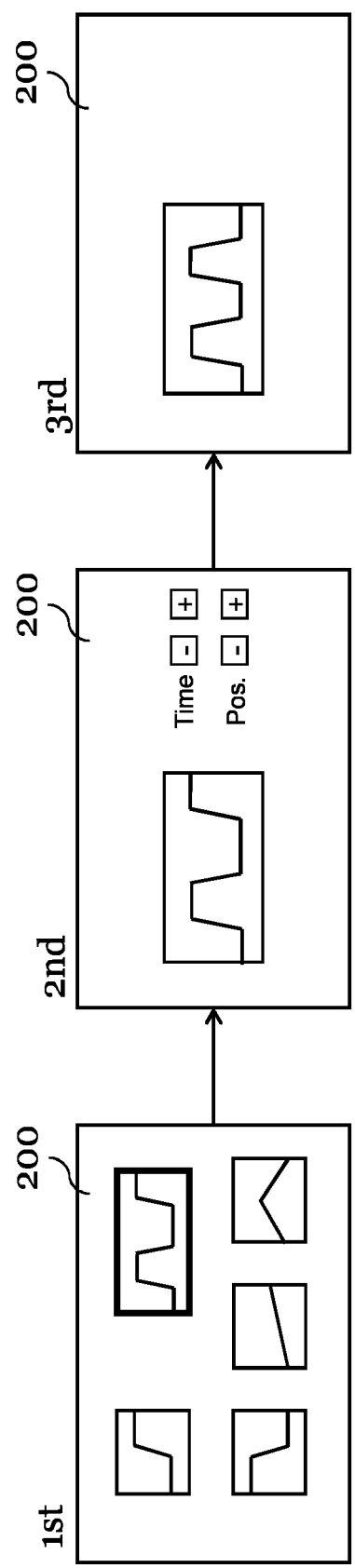
FIGS. 2*a-b* show schematic diagrams of display views of the measurement instrument according to further embodiments.
Figure 2B:
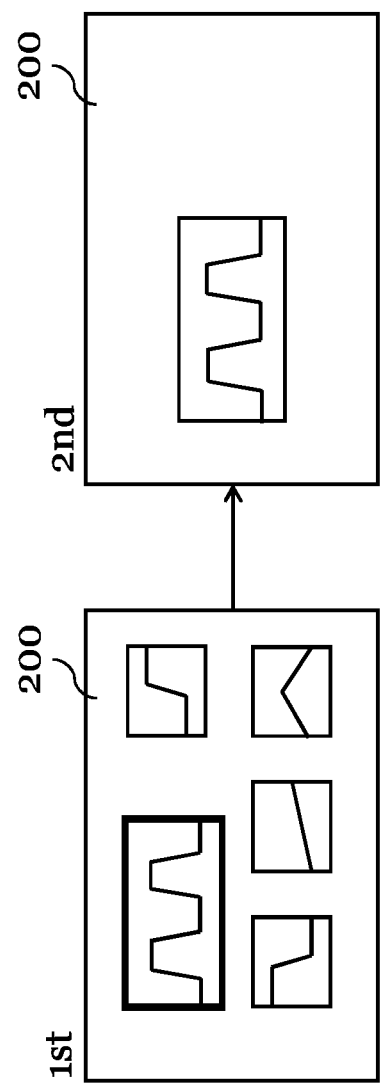

FIGS. 2a and 2b show schematic diagrams of display views 200 of the measurement instrument 100 according to an embodiment. In particular, FIGS. 2a and 2b show graphical representations of the waveforms of the input signal on the display unit in of the measurement instrument 100 shown in FIG. 1.

FIG. 2a shows a step-by-step selection and adjustment of a depicted waveform by a user. Thereby, the measurement instrument 100 uses an adjustment function that is not yet adapted based on previous user input, e.g. directly after manufacture of the measurement instrument 100.

The first display view 200 in FIG. 2a, shows various representations of a waveform of the input signal after recording said signal with the measurement unit 101 and initiating an auto-adjust function of the instrument 100. The representations can be alternative waveform views of the input signal that offer the user choices and options for analyzing the input signal. The first display view 200 in FIG. 2a shows the result of an automatic adjustment process that is carried out by the measurement instrument 100. The composition, selection and parameters of these representations are controlled by the control configuration that is determined by the adjustment function.

In a second step (second display view in FIG. 2a), the user makes manual adjustments to the instrument settings, e.g. to select a specific waveform representation and further customize this selection. The third display view in FIG. 2a shows the result of the selections made by the user.

When the user makes these manual adjustments, the processing unit 103 can be configured to continuously compare the resulting instrument settings and/or the resulting visual output of the measurement instrument 100 to the automatically set configurations according to the control configuration.

The user's actions to adjust the instrument settings can be recorded for the respective signal analysis category. The user may support this process by indicating when a satisfactory measurement has been obtained, e.g. by storing/printing the measurement result or by pressing a dedicated "Like"— button.

FIG. 2b shows the display views of waveforms of the same input signal generated with an adjustment function that was adapted according to previous user input and selections.

Based on the collected information about the user preferences and inputs, the measurement instrument 100 can adapt its auto-adjustment capabilities to match the previously observed user preferences more closely. This is achieved by adapting the adjustment function to select a more suitable control configuration for the respective signal analysis category. The representations of the waveform in the first display view 200 in FIG. 2b are, for example, generated by such an adapted adjustment function.

In particular, the more suitable control configuration chosen by the adapted adjustment function generates a ranking among multiple waveform suggestions and/or changes specific instrument parameters to reflect the observed preferences of the user. For example, if the user previously selected a setup, which displays a few periods of the input signal, and then adjusts the time-base to show three full periods of the signal, the adjustment function can be adapted such that the display view shows three full periods of a similar signal in the future.

Optionally, the user may choose the measurement task category explicitly from a list that is displayed in the display unit 111 to further improve the provided assistance. For this, the instrument manufacturer can create and update a catalog of such categories based on the expected and observed usage of the instrument 100. For example, the manufacturer might introduce a category for measurement tasks with switching power supplies.

By this dynamic adaption of the adjustment function, the function and the ranking of multiple plausible configurations can improve over time and match the user's preferences more closely, resulting in more efficient and more pleasant use of the instrument.

Figure 3:
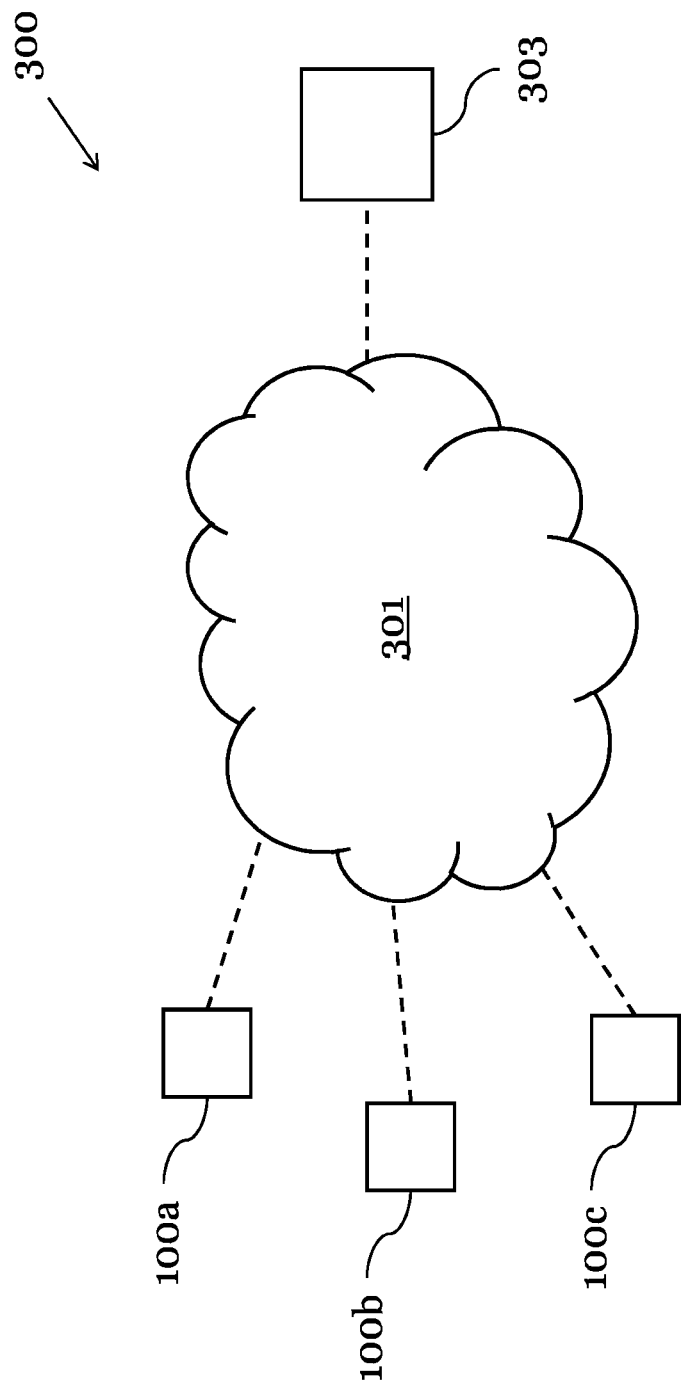
FIG. 3 shows a schematic diagram of a system for updating measurement instruments according to an embodiment.

FIG. 3 shows a schematic diagram of a system 300 for updating measurement instruments 100a-c according to an embodiment.

The system 300 comprises at least one measurement instrument 100a-c, wherein each of the at least one measurement instruments 100a-c has a measurement unit adapted to receive an input signal, a user interface adapted to display at least one waveform of the input signal based on a control configuration, which defines settings and/or configurations of the measurement instrument, wherein the user interface is adapted to receive a user input to modify the settings and/or configurations of the measurement instrument.

For instance, each of the measurement instruments 100a-c shown in FIG. 3 can correspond to the measurement instrument 100 as shown in FIG. 1 or to an instrument with similar capabilities and functions.

The system 300 further comprises a remote server 303, in particular a cloud server; wherein the at least one measurement instrument 100a-c and the remote server 303 are connected via a communication network 301. The at least one measurement instrument 100a-c is configured to forward information about the input signal and/or the user input to the remote server 303, and the remote server 303 is configured to analyze the information about the input signal and/or the user input and to generate update data for updating the at least one measurement instrument 100a-c based on said analysis.

Preferably, the updating data comprises data to update an adjustment function of the at least one measurement instrument 100a-c. This adjustment function is configured to generate the control configuration of the measurement instrument 100a-c, preferably based on a signal analysis category determined by the measurement instrument 100a-c.

The information about the input signal that is forwarded to the remote server 303 may comprise information about the signal class of the input signal and/or a determined signal analysis category for analyzing the input signal.

As indicated in FIG. 3, the remote server 303 can be configured to receive information about input signals and associated user input from multiple different measurement instruments 100a-c that are connected to the communication network 301. The remote server 303 can be configured to generate the update data based on an analysis of the received information from the multiple different measurement instruments 100a-c and from multiple users of each instrument 100a-c. By centrally collecting and analyzing the user data of many users, the initial adjustment function for a specific instrument can continuously be improved.

The remote server 303 can further be configured to execute a machine-learning algorithm, in particular an incremental learning algorithm, to analyze the information about the input signal and the user input and/or to generate the update data.

In particular, the machine-learning algorithms can be applied to the combined data from multiple users of the measurement instrument 100. This algorithm can be configured to regularly determine a neural network configuration which is based on the combined preferences of the users.

The server 303 can be configured to combine incoming usage data from multiple instrument types for analysis and generate separate update data sets for each instrument type, taking into account the specifications of the instrument type and the expected user base. In this way, new instrument types can be updated based on learned data from older instrument types.

Preferably, the remote server is configured to forward the update data to the at least one measurement instrument 100a-c via the communication network. The update data can be forwarded in the form of a software or firmware update for the at least one measurement instrument 100a-c.

Thereby, the system 300 may generate different configurations for different groups of users (as defined by their preferred categories of measurement tasks) or even a customized neural network configuration for each user which puts a higher weight on the preferences of that user.

After installing the update data on a measurement instrument 100a-c, the user can, for instance, choose between different models for the adjustment function which have been optimized for different application areas.

Based on the observed signals and user adjustments the server 303 can communicate with a user to suggest upgrades or enhancements to the instruments 100a-c. For example, if a user often operates one of the instruments 100a-c at the upper limit of its frequency range, an operator of the system 300, e.g. a manufacturer, could offer an option to increase the bandwidth.

The communication network 301 can be a cloud network and the server 303 can be a cloud server within the cloud network. By such a cloud service, the preferences of a large number of users can be analyzed, resulting in further improvements, even for first-time users or for users confronted with new measuring scenarios. In particular, the communication network 301 can be an IP-based network.

Figure 4:
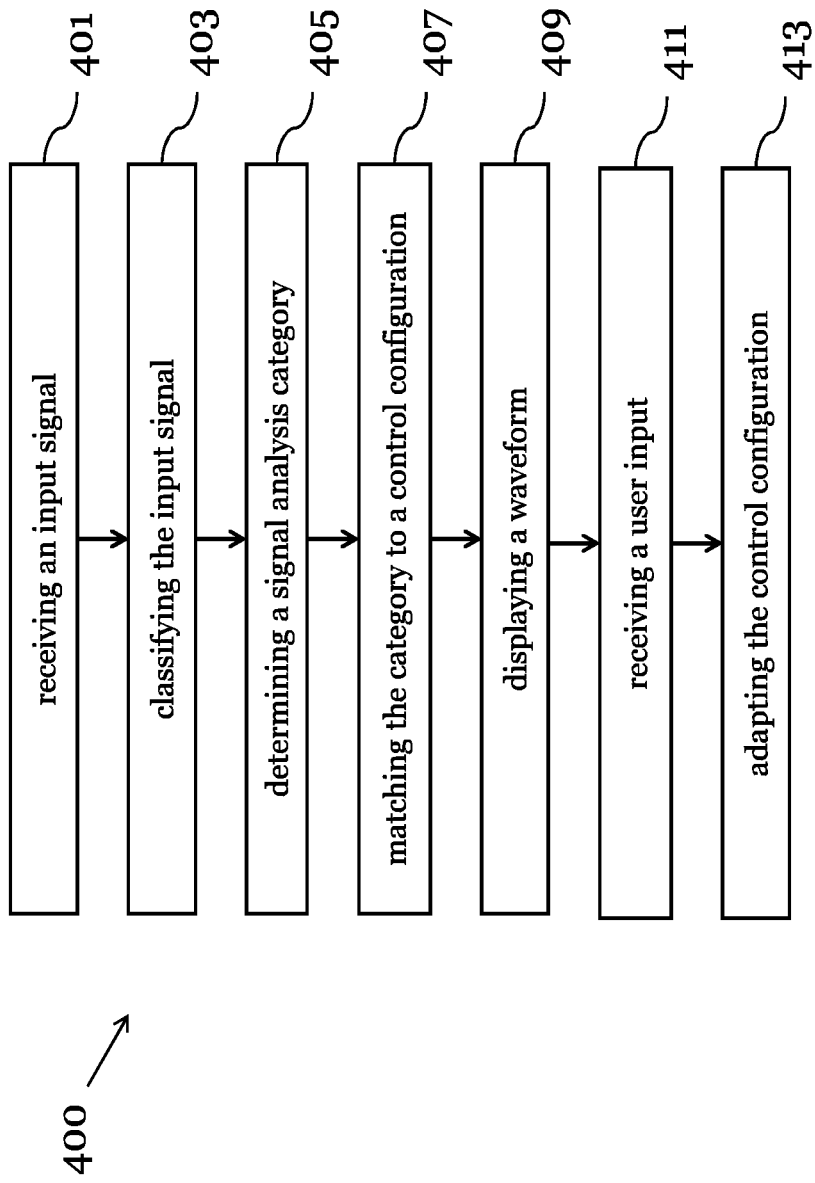
FIG. 4 shows a schematic diagram of a method for controlling a measurement instrument according to an embodiment.

FIG. 4 shows a schematic diagram of a method 400 for controlling a measurement instrument according to an embodiment. In particular, the method 400 can be carried out by the measurement instrument 100 according to FIG. 1.

The method 400 comprises the steps of:
receiving 401 the input signal;
classifying 403 the input signal, preferably based on signal parameters or characteristics of the input signal;
determining 405 a signal analysis category for the input signal based on said classification 403 of the input signal;
matching 407 the determined signal analysis category of the input signal to the control configuration based on the adjustment function, wherein the control configuration defines settings and/or configurations of the measurement instrument 100;
displaying 409 at least one waveform of the input signal based on the control configuration;
receiving 411 the user input to modify the settings and/or configurations of the measurement instrument; and
dynamically adapting 413 adjustment function based on said user input.

Preferably, the adjustment function is dynamically adapted 413 based on the user input by the machine-learning algorithm, which can be an incremental learning algorithm.

A current user of the measurement instrument 100 can be determined, wherein the adjustment function can be configured to match the control configuration to the determined signal analysis category based on the current user of the measurement instrument. In particular, the adjustment function is also dynamically adapted based on the identity of the user making the user input.

Preferably, the method 400 comprises the addition step of: transmitting information about the input signal and/or the user input to the remote server 303.

All features of all embodiments described, shown and/or claimed herein can be combined with each other.

The invention claimed is:

1. A measurement instrument, comprising:
a measurement device adapted to receive an input signal;
a processor adapted to classify the input signal based on signal parameters or characteristics of the input signal;
wherein the processor is adapted to determine a signal analysis category for the input signal based on said classification of the input signal, and to match the determined signal analysis category to a control configuration, which defines settings and/or configurations of the measurement instrument, based on an adjustment function; and
a user interface configured to display the control configuration or certain aspects of the control configuration and at least one graphical representation of the input signal based on the control configuration;
wherein the user interface is adapted to receive a user input to modify the settings and/or configurations of the measurement instrument;
wherein the processor is configured to dynamically adapt the adjustment function based on changes made by the user to the control configuration with said user input; and
wherein the processor is configured to determine, via login or password, a current user of the measurement instrument, wherein the adjustment function is configured to match the control configuration to the determined signal analysis category based on the current user of the measurement instrument.

2. The measurement instrument of claim 1, wherein the processor is adapted to learn from a difference between the settings and/or configurations defined by the control configuration and the modifications to said settings and/or configurations made by the user input.

3. The measurement instrument of claim 1, wherein the processor is configured to execute a machine-learning algorithm, which is configured to dynamically adapt the adjustment function based on the user input.

4. The measurement instrument of claim 1, wherein the processor is configured to dynamically adapt the adjustment function based on said user input and an identity of the user making said user input.

5. The measurement instrument of claim 1, further comprising a network interface adapted to transmit information about the input signal and/or the user input to a remote server.

6. A system for updating measurement instruments, comprising:
at least one measurement instrument, having:

a measurement device adapted to receive an input signal, and a user interface adapted to display at least one waveform of the input signal based on a control configuration, which defines settings and/or configurations of the measurement instrument, and to display the control configuration or certain aspects of the control configuration, wherein the user interface is adapted to receive a user input to modify the settings and/or configurations defined by the control configuration of the measurement instrument;

a remote server;

wherein the at least one measurement instrument and the remote server are connected via a communication network;

wherein the at least one measurement instrument is configured to forward information about the input signal and the user input to the remote server;

wherein the remote server is configured to analyze the information about the input signal and the user input and to generate update data for updating the at least one measurement instrument based on said analysis;

wherein the update data comprises data to update an adjustment function of the at least one measurement instrument, wherein the adjustment function is configured to generate and/or select the control configuration of the at least one measurement instrument; and wherein the measurement instrument is configured to determine, via login or password, a current user of the measurement instrument, wherein the adjustment function is configured to match the control configuration to the determined signal analysis category based on the current user of the measurement instrument.

7. The system of claim 6, wherein the remote server is configured to receive information about input signals and associated user input from multiple different measurement instruments that are connected to the communication network, wherein the remote server is configured to generate the update data based on an analysis of the received information from the multiple different measurement instruments.

8. The system of claim 6, wherein the remote server is configured to execute a machine-learning algorithm to analyze the information about the input signal and/or the user input, and/or to generate the update data.

9. The system of claim 6, wherein the remote server is configured to forward the update data to the at least one measurement instrument via the communication network.

10. A method for controlling a measurement instrument, comprising the steps of:

receiving an input signal;

classifying the input signal based on signal parameters or characteristics of the input signal;

determining a signal analysis category for the input signal based on said classification of the input signal;

matching the determined signal analysis category of the input signal to a control configuration, which defines settings and/or configurations of the measurement instrument, based on an adjustment function;

displaying the control configuration or certain aspects of the control configuration and at least one graphical presentation of the input signal based on the control configuration;

receiving a user input to modify the settings and/or configurations of the measurement instrument; and dynamically adapting the adjustment function based on changes made by the user to the control configuration with said user input, wherein a current user of the measurement instrument is determined via login or password, wherein the adjustment function is configured to match the control configuration to the determined signal analysis category based on the current user of the measurement instrument.

11. The method of claim 10, comprising the further step of: learning from a difference between the settings and/or configurations defined by the control configuration and the modifications to said settings and/or configurations made by the user input.

12. The method of claim 10, wherein the adjustment function is dynamically adapted based on the user input by a machine-learning algorithm.

13. The method of claim 10, wherein the adjustment function is dynamically adapted based on said user input and an identity of the user making said user input.

14. The method of claim 10, further comprising the step of: transmitting information about the input signal and/or the user input to a remote server.

* * * * *